United States Patent [19]
Wu et al.

[11] Patent Number: 5,381,754
[45] Date of Patent: Jan. 17, 1995

[54] $CSB_3O_5$ CRYSTAL AND ITS NONLINEAR OPTICAL DEVICES

[75] Inventors: Yicheng Wu, Anhui, China; Takatomo Sasaki, Suita, Japan

[73] Assignee: University of Science and Technology of China, Anhui, China

[21] Appl. No.: 51,445

[22] Filed: Apr. 23, 1993

[30] Foreign Application Priority Data

Apr. 23, 1992 [CN] China ............................. 92102773.7

[51] Int. Cl.⁶ ........................ H01S 3/109; G02F 1/37; B01J 17/04
[52] U.S. Cl. ........................................ 117/13; 372/22; 372/21; 359/328; 117/36; 117/944
[58] Field of Search ............. 359/328, 329, 332, 326, 359/327; 372/21, 22; 385/122; 65/3.11, 3.13; 455/323; 156/600, 622, 624

[56] References Cited

U.S. PATENT DOCUMENTS

| | | | |
|---|---|---|---|
| 3,934,154 | 1/1976 | Cook, Jr. | 359/328 |
| 3,949,323 | 4/1976 | Bierlein et al. | 332/7.51 |
| 4,231,838 | 11/1980 | Gler | 156/600 |
| 4,793,894 | 12/1988 | Jacco et al. | 156/623 R |
| 4,826,283 | 5/1989 | Chuangtian et al. | 350/96.12 |
| 5,123,022 | 1/1992 | Ebbers et al. | 359/328 X |

FOREIGN PATENT DOCUMENTS

| | | |
|---|---|---|
| 1487 | 1/1978 | Japan . |
| 249698 | 4/1989 | Japan . |
| 241529 | 9/1989 | Japan . |

OTHER PUBLICATIONS

Physics and Chemistry of Glasses, vol. 16, No. 5, Oct. 1975, pp. 108-111 (by A. J. Marlor et al.
Acta Cryst. (1960) 13, 889, pp. 889-892 (By Krogh-Moe).
Acta Cryst. (1974) B30, 1178, pp. 1178-1180 (By Krogh-Moe).
Arkiv For Kemi Band 12 nr 26, 1958 pp. 247-249 (By Krogh-Moe).
Scientia Sinica (Series B), vol. XXVIII No. 3, Mar. 1985, pp. 235-243 (By Chen Chuangtian, et al.).

*Primary Examiner*—Rodney B. Bovernick
*Assistant Examiner*—Hemang Sanghavi
*Attorney, Agent, or Firm*—Victor Flores

[57] ABSTRACT

The present invention relates to single crystals of $CsB_3O_5$ having large dimension and high quality which can be grown by pulling methods. The single crystals of $CsB_3O_5$ are useful as NLO materials. The NLO devices made of $CsB_3O_5$ single crystals can be used in a laser system of high power density and relatively large divergence and posses a character of high SHG conversion efficiency. Moreover, the NLO devices of the present invention are capable of producing coherent harmonics of wavelength as short as 170 nm and tolerating larger processing error of crystals.

2 Claims, 2 Drawing Sheets

CsB₃O₅ CRYSTAL AND ITS NONLINEAR OPTICAL DEVICES

FIELD OF THE INVENTION

The present invention relates to $CsB_3O_5$ single crystal, process for making the same and nonlinear optical (NLO) devices made of single crystals of $CsB_3O_5$.

BACKGROUND OF THE INVENTION

When a beam of laser propagates in a crystal with non-zero components of the second order polarizability tensor, the crystal will produce NLO effects such as second harmonic generation (SHG), sum-frequency generation (SFG), difference-frequency generation (DFG) and parametric amplification (OPA). NLO devices such as second harmonic generators, up and down frequency converter and parametric oscillator can be prepared using crystals having NLO properties (Please refer to U.S. Pat. Nos. 3,262,058, 3,328,723, 3,679,907, 3,747,022, 3,949,323 and 4,826,283).

Second harmonic generation (SHG) is the most important NLO effect. An electromagnetic wave with frequency of w propagating in a NLO crystal will induce a polarization wave of a frequency of 2 w. That is the so-called "SECOND HARMONIC GENERATION". The conversion efficiency of a SHG crystal is proportional to the effective SHG coefficient ($d_{eff}$) square and the input laser power, and is also relative with the phase-matching condition. When other conditions are selected, if phase matching is achieved, the conversion efficiency will reach the maximum. Generally, there are two types of phase-matching: Type I wherein the two incident waves have the same polarization; and Type II wherein the two waves have orthogonal polarization. The most-commonly used method for achieving phase-matching is to find a suitable orientation of the crystal as the propagating orientation of incident waves, and along this orientation, the refractive indices are the same for both the fundamental and the second harmonic waves. When the orientation of the crystal drifts from this special orientation, phase-mismatching will generally occur. The value of acceptance angle of a crystal reflects the affecting extent on the conversion efficiency when the acceptance angle drifts from the phase-matching condition. In addition, due to the influence of the double refraction of crystal which results in the difference between the energy propagation direction and the phase direction, the fundamental wave and second harmonic wave will separate each other after they propagate in the crystal for a certain distance. That is so-call WALK-OFF effect. The walk-off angle restricts the length of crystal having effective function.

Desirable NLO crystals should have the following requisites: great nonlinear polarization coefficient; wide transparency range; good phase-matching condition and high damage threshold; easy to grow; and easy to obtain a single crystal with large dimension and high quality.

BBO (barium betaborate, low temperature modification: $B-BaB_2O_4$) and LBO (lithium triborate: $LiB_3O_5$) are excellent NLO crystals of borates developed in recent years, and have been used widely in NLO devices, especially in NLO devices which can stand up to lasers with high power density (See Scientia, Sinica, B28, 235, 1985; U.S. Pat. No. 4,826,283 and Chinese Patent No. 88102084). It has been found that BBO has good UV transparency ability (UV absorbing edge is 190 nm); high damage threshold (15 $GW/cm^2$, 0.1 ns, 1064 nm); and great effective SHG coefficient (about 6 times of that of KDP). The main disadvantage of BBO is that the z component of its SHG coefficients is too small ($d_{31} < 0.07\ d_{11}$) to restrict its use in deep UV range and in laser systems of larger divergence. In addition, because of acceptance angle of BBO (<1 mrad-cm) is too small, high working accuracy is needed for it.

The UV transparent ability of LBO (UV absorption edge is 160 nm) is the best and the damage threshold of LBO SINGLE CRYSTAL (25 $GW/cm^2$, 0.1 ns, 1064 nm) is the highest among the NLO crystals. However, LBO is an incongruent compound which must be prepared by flux method, the period of its production is much longer (over 1 month), the yield is low, and the cost for production is high.

J. Krogh-Moe first reported the crystal structure of cesium triborate, $CsB_3O_5$ (Acta Crystallography, Vol. 13, 889–892, 1960; and Acta Crystallography, Vol. B30, 1178-1180, 1974). It crystallizes in the space group $P2_12_12_1$, and is a biaxial crystal. The largest crystalline size reported was only $0.10 \times 0.17 \times 0.046\ mm^3$. A. J. Marlor et. al. studied the crystallization kinetics of $CsB_3O_5$ from its undercooled melt using microscope (Physics and Chemistry of Glasses, Vol. 16, 108-14 111, 1975). However, neither a single crystal of $CsB_3O_5$ with a size large enough for examining its physical properties, nor devices made of $CsB_3O_5$ have ever been reported until now.

OBJECTIVE OF THE INVENTION

One objective of the present invention is to provide $CsB_3O_5$ single crystals with enough size which can be used to prepare NLO devices and process for making the same.

Another objective of the present invention is to provide a NLO device which can generate coherent radiations of wave-length as short as 170 nm.

SUMMARY OF THE INVENTION

The present invention relates to a NLO device comprising means to direct at least one incident beam of electromagnetic radiation into one crystal having NLO properties whereby electromagnetic radiation emerging from the crystal contains at least one frequency that is different than the frequency of any incident beam of radiation, wherein the crystal is a single crystal of $CsB_3O_5$.

By using the NLO devices made of $CsB_3O_5$ single crystals of the present invention, and emerging radiation with a wave-length as short as 170 nm can be generated; and they can work at power levels in excess of 10 $GW/cm^2$, and no damage of the device has taken place.

The single crystal of $CsB_3O_5$ of the present invention is grown by the processing comprising:
  mixing a cesium salt with $B_2O_3$ or $H_3BO_3$ at such an amount to make the mole ratio of $Cs_2O$ to $B_2O_3$ being at 1:3;
  heating and melting the mixture to obtain a melt of $CsB_3O_5$, maintaining the temperature of the melt at a temperature of about 50°–200° C. higher than the melting point of $CsB_3O_5$ (about 837° C.) for about 5–20 hours in a Pt crucible;
  decreasing the temperature of the melt to a temperature of about 0°–2.0° C. higher than the melting point of $CsB_3\ O_5$ and inserting a seed of $CsB_3\ O_5$ crystal into the crucible from the top, keeping the seed in contact with the melt, rotating the seed at a speed less than 45 rpm and pulling it upward at a speed in the range of 0-5 mm/hour;

maintaining the growth of crystal at the conditions mentioned above for about 1-20 days;

cooling it to room temperature at a rate of 30°-100° C. per hour.

According to the present invention, the cesium salts include $Cs_2CO_3$, $CsNO_3$ and $CsCl$.

According to the present invention, the growth of $CsB_3O_5$ single crystals is easier than those of LBO and BBO, the production period for the growth of the $CsB_3O_5$ is shorter than those of LBO and BBO. Therefore, the cost for the production of $CsB_3O_5$ is less than those of LBO, BBO.

BRIEF DESCRIPTION OF DRAWINGS OF THE INVENTION

DETAILED DESCRIPTION OF THE INVENTION

The present invention will be described in detail hereinafter.

$CsB_3O_5$ can be prepared by the reaction of a cesium salt, for example $Cs_2CO_3$, $CsNO_3$, $CsCl$ and the like, with $B_2O_3$ or $H_3BO_3$ according to any one of the following chemical reaction equations:

$Cs_2CO_3 + H_3BO_3 \rightarrow CsB_3O_5 + H_2O \uparrow + CO_2 \uparrow$ (1)

$Cs_2CO_3 + B_2O_3 \rightarrow CsB_3O_5 + CO_2 \uparrow$ (2)

$CsNO_3 + H_3BO_3 \rightarrow CsB_3O_5 + H_2O \uparrow + NO_2 \uparrow + O_2 \uparrow$ (3)

$CsNO_3 + B_2O_3 \rightarrow CsB_3O_5 + NO_2 \uparrow + O_2 \uparrow$ (4)

$CsCl + H_3BO_3 + O_2 \rightarrow CsB_3O_5 + H_2O \uparrow + Cl_2 \uparrow$ (5)

$CsCl + B_2O_3 + O_2 \rightarrow CsB_3O_5 + Cl_2 \uparrow$ (6)

Figure 2:
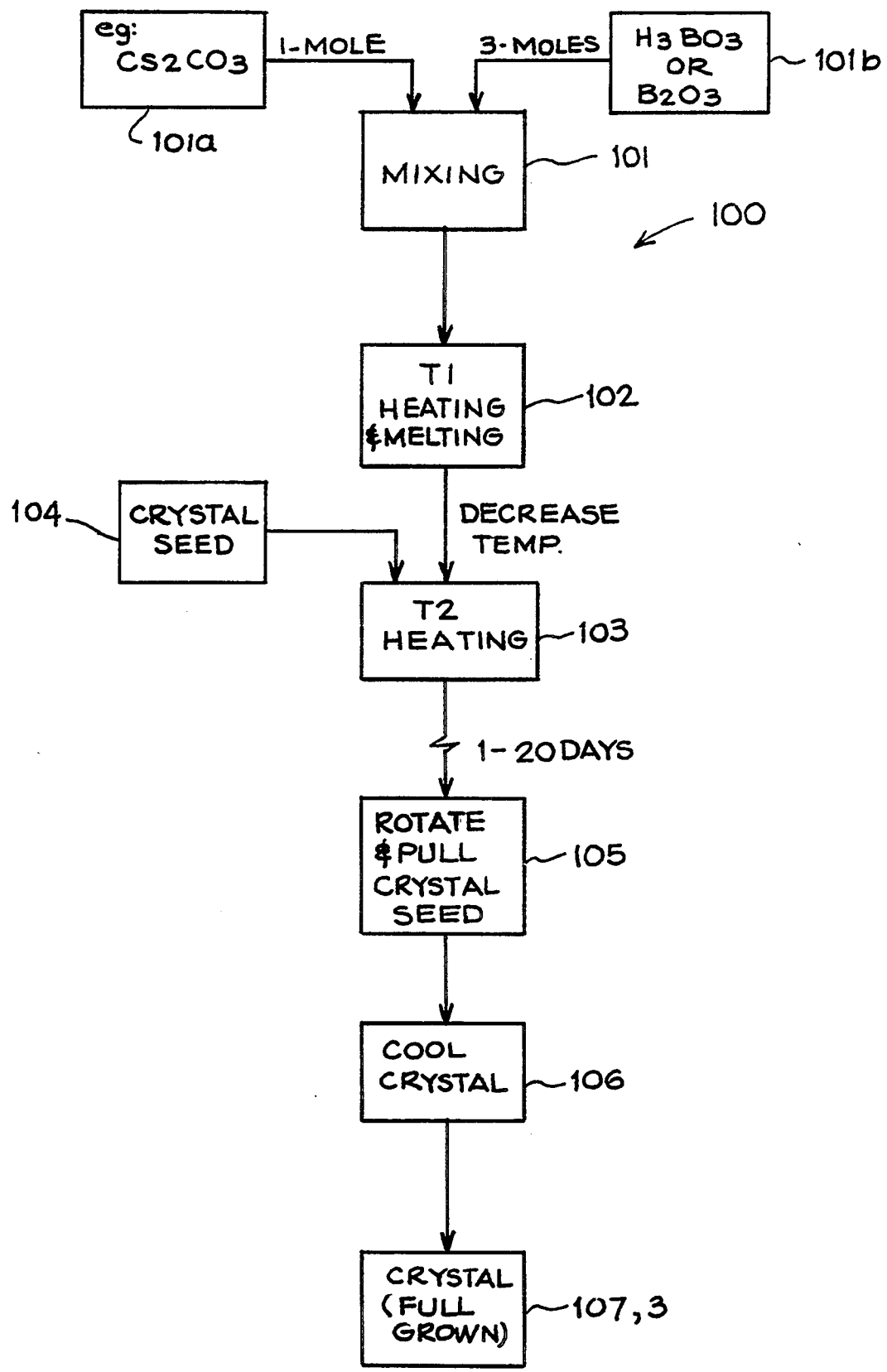
FIG. 2 illustrates in block diagram the process flow of the present invention.

According to the present invention and as illustrated in FIG. 2, the single crystal of $CsB_3O_8$ is prepared by an improved top-seeding method 100 comprising:

(a) a mixing step 101 comprising combining a cesium salt from a source 101a with $B_2O_3$ or $H_3BO_3$ from a source 101b at such an amount to make the mole ratio of $Cs_2CO_3$ to $B_2O_3$ being at 1:3;

(b) a heating and melting step 102 of the mixture from step 101 to obtain the melt of $CsB_3O_5$ in a Pt crucible, maintaining the temperature of said melt at a temperature T1 of about 50°-200° C. higher that the melting point of $CsB_3O_5$ (about 837° C.) for about 5-20 hours;

(c) a step 103 of decreasing the temperature of the melt to a temperature T2 of about 0°-2.0°0 C. higher than the melting point of $CsB_2O_5$ and a step 104 of inserting a seed of $CsB_3O_5$ crystal into the crucible from the top, keeping the seed in contact with the melt, a step 105 of rotating the seed at a speed less than 45 rpm including pulling it upward at a speed in the range of 0-5 mm/hour;

(d) maintaining the growth of crystal at the condition mentioned above for about 1-20 days; and (e) a step 106 of cooling the hot grown crystal to room temperature at a rate of 30°-100° C. per hour and a step 107 of producing a grown crystal $CsB_2O_5$, as indicated by numeral 3.

By adopting the above-mentioned method, a single crystal with a size of dia. $20 \times 35$ mm³ (approx. $20 \times 20 \times 35$ mm³) can be obtained. The inventor of the present invention have first discovered that the crystals of a compound having formula $CsB_3O_5$ possess the following NLO properties;

1. A wide transparent range of wavelength:

The inventors of the present invention have examined the transmission characteristics of $CsB_3O_5$ single crystals, and have found that the $CsB_3O_5$ single crystals are transparent in the wavelength range of 170 nm to 3000 nm.

2. Employing the method of prism minimum deviation, the inventors of the present invention also measured the principal refractive indices of $CsB_3O_5$. Using the least square fitting method, the Sellmeier equations were obtained as follows:

$$n_x^2 = 2.2916 + \frac{0.02105}{\lambda^2 + 0.06525} - 3.1848 \times 10^{-5} \times \lambda^2$$

$$n_y^2 = 2.3731 + \frac{0.03437}{\lambda^2 + 0.1160} - 7.2632 \times 10^{-5} \times \lambda^2$$

$$n_z^2 = 2.4607 + \frac{0.03202}{\lambda^2 + 0.08961} - 5.6332 \times 10^{-5} \times \lambda^2$$

3. large effective SHG coefficient:

The inventors of the present invention also measured the SHG powder data of $CsB_3O_5$ single crystals using powder SHG technique, and found that the effective SHG coefficient of $CsB_3O_5$ is about 3 times of that of KDP, similar to that of LBO.

4. Large z component of the SHG coefficients:

$CsB_3O_5$ single crystals belong to the point group of $D_2$, and have one independent non-zero SHG coefficient $d_{14}$ which is the z component of the SHG coefficients. The value of the z component of the SHG coefficients ($d_{14}$) measured by the phase-matching method is about $0.468 \times d_{11}$ (BBO).

5. High damage threshold:

The damage threshold of $CsB_3O_5$ single crystals at different directions is in the range of 20-28 GW/cm² for a 1053 nm, 1.0 ns laser pulse.

6. The phase-matching angle of $CsB_3O_5$ single crystals is as follows:

$\theta = 59.4°$ and $\phi = 0°$, for type I (SHG).

7. The acceptance angle of $CsB_3O_5$ single crystals is 1.12 mrad-cm, larger than that of BBO (the acceptance angle of BBO is 0.6 mrad-cm).

8. The walk-off angle of $CsB_3O_5$ single crystals is 1.76°, which is smaller than that of BBO (the walk-off angle of BBO is 3.2°).

It can be seen from above that single crystals of compounds having the formula of $CsB_3O_5$ is a kind of novel NLO crystal having excellent NLO properties. The NLO devices made of the $CsB_3O_5$ crystals obtained by the process of the present invention have been major advantages of those NLO devices made either of BBO or LBO crystals; high SHG conversion efficiency; low requirement for divergence; great resistance to radiation damage. In addition, they have the capability of generating UV radiations of wavelength as short as 170 nm.

Figure 1:
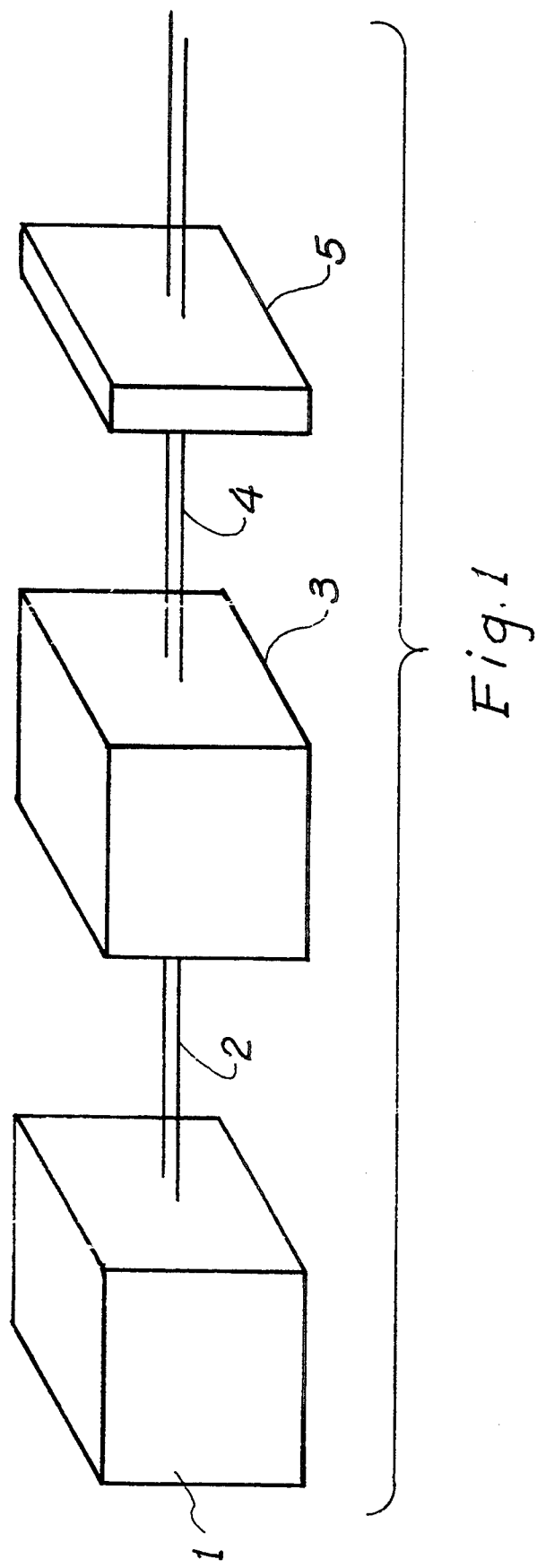
FIG. 1 illustrates the principle of the typical NLO device made of a single crystal of $CsB_3O_5$ of the present invention.

FIG. 1 illustrates the principle of a typical NLO device made of a single crystal of $CsB_3O_5$. In the Figure, a coherent electromagnetic beam 2 produced by a laser 1 is introduced into a $CsB_3O_5$ crystal 3. The resultant emerging beam 4 is then caused to pass through a filter 5 so that the beam of concern is obtained. In other words, the NLO device made of $CsB_3O_5$ crystal of the present invention comprises means to direct at least one incident beam of electromagnetic radiation into the $CsB_3O_5$ crystal whereby electromagnetic radiation emerging from said crystal contains at least one frequency different from the frequency of any incident beam of radiation. The devices made of $CsB_3O_5$ single crystal of present invention can be used as second harmonic generators, up and down frequency converters, optical parametric oscillators and the like. For the SHG case, beam 2 is of fundamental frequency while departing beam 4 additionally contains a wave of a frequency corresponding with the first harmonic of beam 2, and the wave of fundamental frequency is removed when the beam 4 passes through the filter 5.

The said crystal 3 is so oriented that the crystallographic axes b and c (not shown) are at angles $\theta$ and $\phi$ respectively from the optical path through the crystal. Angles $\theta$ and $\phi$ are phase-matching angles of $CsB_3O_5$ crystal 3. H. V. Hobden (J. Appl. Phys. 38, 4365, 1973) discusses the details of phase-matching in a biaxial crystal.

EXAMPLE 1

A Pt. crucible with a size of 50 mm in diameter×40 mm in height was charged by a homogeneous mixture of 79.2 g $CsB_3O_5$ and 89.6 g $H_3BO_3$, and then placed in a crystal growth furnace. The furnace was then sealed with a cover made of thermal insulation material which had a hole disposed on the center of said cover for the free entrance of seed. The furnace was heated rapidly to a temperature of 1000° C., and held at this temperature for 10 hours and then cooled to 838° C. A seed crystal of $CsB_3O_5$, cut along axis c and tied to a shaft with Pt. wire, was inserted into the melt. The seed was rotated at a rate of 20 rpm and pulled upward at a rate of 0.5 mm/hour. When the growth of the single crystal was near the end, the speed of pulling the seed crystal was increased to make it just out of the surface of the melt, and then cooled to room temperature at a rate of 60° C./hour. The final product was a transparent single crystal of $CsB_3O_5$ of size diameter 20×20 mm³ (*approx.* 20×20×20 mm³). The period for the crystal growth was 2 days and the period for the crystal production was 4 days.

EXAMPLE 2

A Pt. crucible with a size of 50 mm in diameter×55 mm in height was charged by a homogeneous mixture of 118.2 g $Cs_2CO_3$ and 133.8 g $H_3BO_3$, and then placed in a crystal growth furnace. The furnace was then sealed with a cover made of thermal insulation material which had a hole disposed on the center of said cover for the free entrance of seed. The furnace was heated rapidly to a temperature of 950° C., and held at this temperature for 12 hours and then cooled to 837°0 C. A seed crystal of $CsB_3O_5$ cut along axis c and tied to a shaft with sa Pt. wire was inserted into the melt. The melt was then cooled at a rate of 0.2° C./day and the seed was rotated at a rate of 30 rpm. After 14 days the growth was ended and the obtained crystal was pulled just out of melt and cooled to room temperature at a rate of 50° C./hour. The final product was a transparent single crystal of $CsB_3O_5$ of size up to 21×25×20 mm³.

EXAMPLE 3

A Pt. crucible with a size of 45 mm in diameter×50 mm in height was charged by a homogeneous mixture of 88.2 g $CsNO_3$ and 84.0 g $H_3BO_3$, and then placed in a crystal growth furnace. The furnace was then sealed with a cover made of thermal insulation material which had a hole disposed on the center of said cover for the free entrance of seed. The furnace was heated rapidly to a temperature of 900° C., and held at this temperature for 12 hours and then cooled to 837° C. A seed crystal of $CsB_3O_5$ cut along axis c and tied to a shaft with a Pt. wire was inserted into the melt. The melt was then cooled at a rate of 0.1° C./day and the seed was rotated at a rate of 20 rpm with clock and anticlockwise direction alternatively. After 20 days the growth was ended and the obtained crystal was pulled just out of melt and cooled to room temperature at a rate of 60° C./hour. The final product was a transparent single crystal of $CsB_3O_5$ of size up to 27×17×14 mm³

EXAMPLE 4

The same procedure of Example 2 was carried out by using 56.4 g CsCl and 62.4 g $H_3BO_3$ as raw material. The product obtained thereby was a transparent crystal of $CsB_3O_5$ with the size of 12×10×5 mm³.

EXAMPLE 5

A Pt. crucible with size of 50 mm in diameter×55 mm in height was charged by a homogeneous mixture of 125.9 g $Cs_2CO_3$ and 81.1 g $B_2O_3$, and then placed in a crystal growth furnace. The furnace was then sealed with a cover made of thermal insulation material which had a hole disposed on the center of said cover for the free entrance of seed. The furnace was heated rapidly to a temperature of 950° C., and held at this temperature for 14 hours and then cooled to 838° C. A seed crystal of $CsB_3O_5$ tied to a shaft with a Pt. wire was inserted into the melt. The seed was rotated at a rate of 45 rpm and pulled upward at a rate of 1 mm/hour. When the growth of single crystal was near the end, the speed of pulling the seed crystal was increased to make it just out of the surface of the melt, and then cooled to room temperature at a rate of 40° C./hour. The final product was a transparent single crystal of $CsB_3O_5$ with a size up to diameter 20×35 mm³ (approx. 20×20×35 mm³). The period for the crystal growth was 2 days, and the period for the crystal production was 4 days.

EXAMPLE 6

A crystal obtained by using the procedure of Example 1 was cut into a body of 6×6×6 mm³ in size with $\theta=59.4°$ and $\phi=0°$ after determination of the crystallographic axes a, b, and c, it was then placed in the optical path shown in the figure. The light source was a Q-modulation Nd: YAG laser of wavelength=1064 nm. The emerging beam of radiation of wavelength=532 nm was obtained.

We claim:

1. A process for growing a NLO $CsB_3O_5$ crystal, said process comprising the steps of:
   (a) mixing a cesium salt with $B_2O_3$ or $H_3BO_3$ in such an amount to make the mole ratio of $Cs_2O$ to $B_2O_3$ be 1:3;
   (b) heating and melting said mixture in a furnace to obtain a melt of $CsB_3O_5$ maintaining a first temperature of said melt 50°–200° C. higher than a melting point of $CsB_3O_5$ for about 5–20 hours in a Pt. crucible;

(c) decreasing said first temperature of said melt to a second temperature 0°–2.0° C. higher than said melting point of $CsB_3O_5$ and inserting a seed of $CsB_3O_5$ crystal into said Pt. crucible from a top of said furnace, keeping said seed in contact with said melt, rotating said seed at a speed less than 45 rpm and pulling said seed upward at a speed in the range of 0–5 mm/hour to initiate growing a $CsB_3O_5$ crystal;

(d) maintaining said growing of said $CsB_3O_5$ crystal as described in said step (c) for about 1–20 days to effect a grown $CsB_3O_5$ crystal; and (e) cooling said grown $CsB_3O_5$ crystal to a room temperature at a rate of 30°–100° C. per hour.

2. A process for growing a NLO $CsB_3O_5$ crystal as described in claim 1, wherein:

said cesium salt being selected from the group of cesium salts including $Cs_2CO_3$, $CsNO_3$ and $CsCl$.

* * * * *